(12) United States Patent  
Oomura

(10) Patent No.: US 8,878,551 B2  
(45) Date of Patent: Nov. 4, 2014

(54) SEMICONDUCTOR INTEGRATED CIRCUIT DEVICE

(75) Inventor: Masanobu Oomura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 474 days.

(21) Appl. No.: 13/204,297

(22) Filed: Aug. 5, 2011

(65) Prior Publication Data

US 2012/0056629 A1    Mar. 8, 2012

(30) Foreign Application Priority Data

Sep. 2, 2010    (JP) ................................. 2010-197145

(51) Int. Cl.
*G01R 27/28* (2006.01)
*H01L 23/00* (2006.01)

(52) U.S. Cl.
CPC .................................... *H01L 23/576* (2013.01)
USPC .......................................................... 324/649

(58) Field of Classification Search
None
See application file for complete search history.

(56) References Cited

U.S. PATENT DOCUMENTS

| | | | | |
|---|---|---|---|---|
| 4,593,384 | A * | 6/1986 | Kleijne | 365/228 |
| 5,389,738 | A * | 2/1995 | Piosenka et al. | 174/528 |
| 7,907,447 | B2 | 3/2011 | Tao et al. | 365/185.11 |
| 8,143,705 | B2 | 3/2012 | Van Geloven et al. | 257/621 |
| 2002/0002683 | A1* | 1/2002 | Benson et al. | 713/194 |
| 2002/0126792 | A1 | 9/2002 | Fuhrmann et al. | 377/1 |
| 2005/0047047 | A1 | 3/2005 | Matsuno | 361/115 |
| 2007/0238201 | A1 | 10/2007 | Funk et al. | 702/83 |
| 2008/0119956 | A1 | 5/2008 | Mangell | 438/758 |

FOREIGN PATENT DOCUMENTS

| | | |
|---|---|---|
| CN | 101517655 A | 8/2009 |
| CN | 101772775 | 7/2010 |
| JP | 2002-319010 | 10/2002 |
| JP | 2003/520451 A | 7/2003 |
| JP | 2005-072514 | 3/2005 |
| JP | 2006-012159 | 1/2006 |
| JP | 2006-293291 | 10/2006 |
| JP | 2006-293921 | 10/2006 |
| JP | 2007-227498 | 9/2007 |
| JP | 2011-221678 | 4/2011 |

OTHER PUBLICATIONS

Office Action issued Apr. 4, 2014 in counterpart Japanese patent application 2010-197145, with translation.
Office Action issued 5 Nov. 2013 in counterpart Chinese patent application 201110252182.8, with translation.

* cited by examiner

*Primary Examiner* — Paresh Patel
(74) *Attorney, Agent, or Firm* — Fitzpatrick, Cella, Harper & Scinto

(57) ABSTRACT

A semiconductor integrated circuit device comprises: a circuit block formed on a semiconductor substrate; an electrically conductive pattern formed over a portion to be protected of the block; a resetting unit configured to reset a potential of a portion of the pattern to a reference potential; a connecting unit configured to connect the portion to a current supply line; and a detection circuit configured to determine whether a preset range includes a voltage of the portion when a predetermined time has elapsed since the portion is connected to the current supply line after the potential of the portion is reset to the reference potential is provided. A change in voltage of the portion depends on a circuit constant of the pattern.

8 Claims, 12 Drawing Sheets

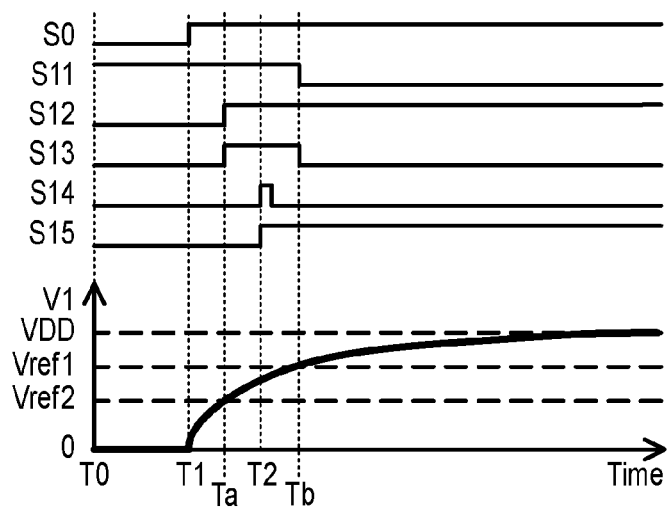
F I G. 3A
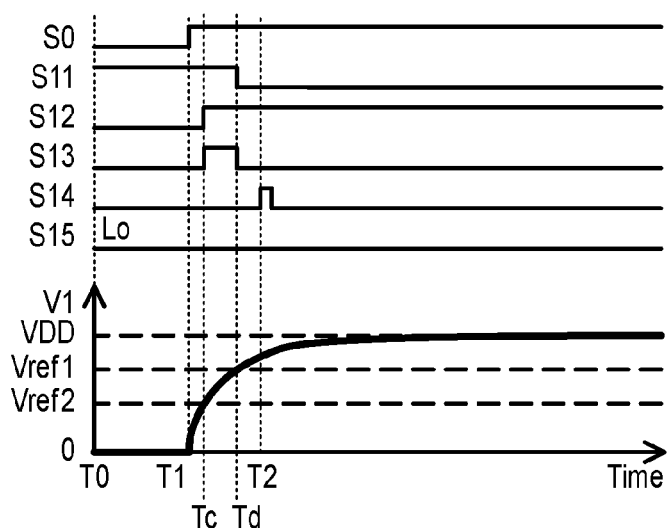
F I G. 3B
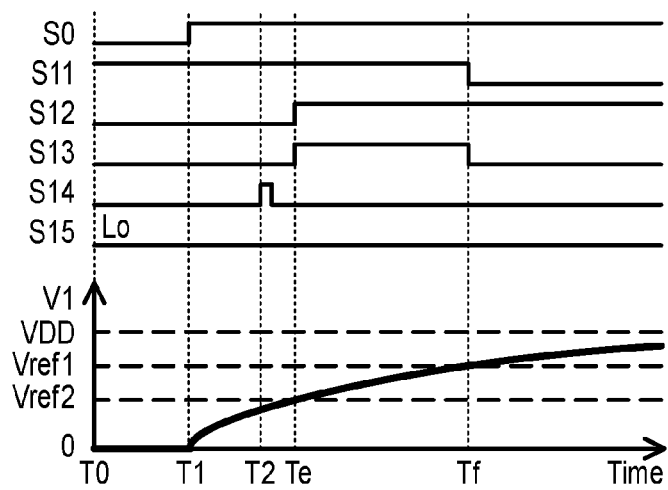
F I G. 3C

SEMICONDUCTOR INTEGRATED CIRCUIT DEVICE

BACKGROUND OF THE INVENTION

1. Field of the Invention

The present invention relates to a semiconductor integrated circuit device.

2. Description of the Related Art

Demand has arisen for protecting, against physical alteration and analysis, a circuit mounted on a semiconductor integrated circuit device for holding data requiring high security such as personal information. In the semiconductor integrated circuit device described in Japanese Patent Laid-Open No. 2006-012159, a wiring line is formed on a circuit to be protected. When detecting a change in voltage of this wiring line, a detection circuit of the semiconductor integrated circuit device determines that the wiring line has been altered. However, a focused ion beam (FIB) apparatus has recently become usable. When using the FIB apparatus, it is possible to cut a wiring line by emitting an ion beam from the front surface of a semiconductor integrated circuit device, and deposit a wiring metal. Even when a circuit is protected using the technique described in Japanese Patent Laid-Open No. 2006-012159, therefore, if the FIB apparatus is used to deposit a wiring metal so as to bypass a portion to be analyzed and apply a predetermined voltage, it is possible to cause a recognition error, that is, it is possible to cause the determination operation of the detection circuit to detect a normal state instead of an abnormal state.

SUMMARY OF THE INVENTION

The method described above of forming an electrically conductive pattern on a circuit block to be protected and detecting the change in potential of this electrically conductive pattern cannot accurately detect alterations to the electrically conductive pattern. Accordingly, an aspect of the present invention provides a technique for improving the accuracy of detection of alterations to an electrically conductive pattern formed on a circuit block to be protected.

An aspect of the present invention provides a semiconductor integrated circuit device comprising: a circuit block formed on a semiconductor substrate; an electrically conductive pattern formed over a portion to be protected of the circuit block; a resetting unit configured to reset a potential of a first portion of the electrically conductive pattern to a reference potential; a connecting unit configured to connect the first portion to a current supply line; and a detection circuit configured to determine whether a preset range includes a voltage of the first portion when a predetermined time has elapsed since the first portion is connected to the current supply line after the potential of the first portion is reset to the reference potential, wherein a change in voltage of the first portion depends on a circuit constant of the electrically conductive pattern.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIGS. 3A to 3C are views for explaining examples of a timing chart of the embodiment of the present invention;

DESCRIPTION OF THE EMBODIMENTS

Figure 1:
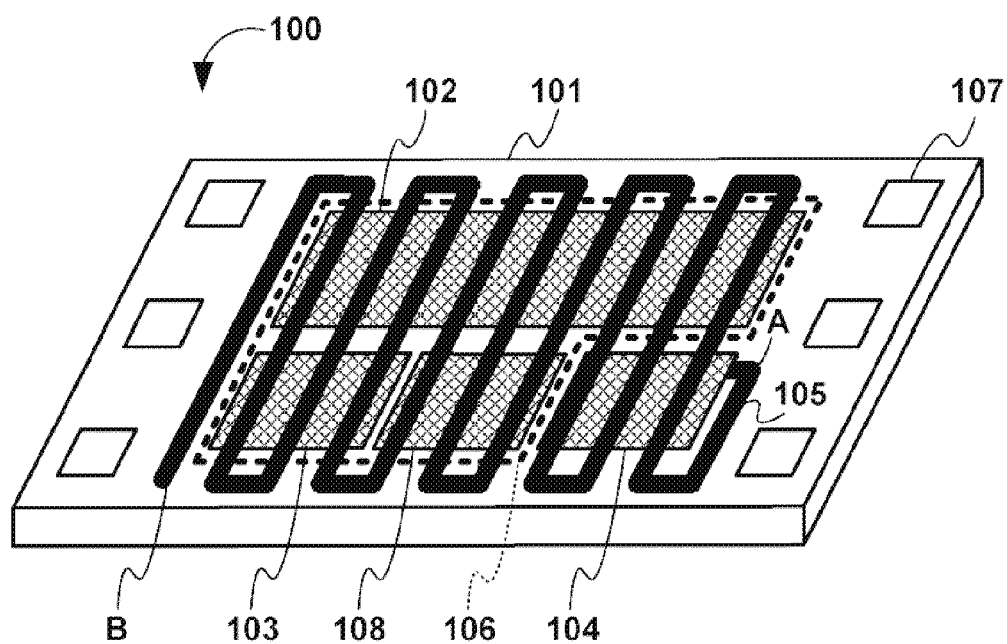
FIG. 1 is a view for explaining an example of the arrangement of a semiconductor integrated circuit device of an embodiment of the present invention.

Embodiments of the present invention will be explained below with reference to the accompanying drawings. A configuration example of a semiconductor integrated circuit device 100 according to an embodiment of the present invention will now be explained with reference to FIG. 1. A semiconductor integrated circuit device 100 can include a memory circuit 102, control circuit 103, processing circuit 108, and detection circuit 104 formed over a semiconductor substrate 101. The memory circuit 102 can include at least one of a nonvolatile memory and volatile memory, and hold data. The control circuit 103 is, for example, a CMOS logic circuit, and can control access of the processing circuit 108 to data held in the memory circuit 102. That is, the control circuit 103 can control write of data to the memory circuit 102 by the processing circuit 108, and read of data from the memory circuit 102 by the processing circuit 108. The processing circuit 108 can process data held in the memory circuit 102, and output the generated data to, for example, an output device. The memory circuit 102, control circuit 103, and processing circuit 108 can form a circuit block 106. The circuit block 106 can be connected to an external device via terminals 107.

An electrically conductive pattern 105 is formed on a circuit block 106. In the example shown in FIG. 1, the electrically conductive pattern 105 is formed by one bent electrically conductive line, and meanders so as to cover all the surfaces of the memory circuit 102, control circuit 103, and detection circuit 104. The electrically conductive pattern 105 need not be formed on all circuits, and need at least be formed over a portion to be protected. For example, the electrically conductive pattern 105 may be formed on a portion of the circuit block 106. That is, the electrically conductive pattern 105 may be formed on only one of the memory circuit 102, control circuit 103, and processing circuit 108. The electrically conductive pattern 105 can also be formed densely so as to prevent a circuit to be protected from being analyzed from above the electrically conductive pattern 105. To increase the change in circuit constant before and after the electrically conductive pattern 105 is altered, it is also possible to form the electrically conductive pattern 105 by the critical dimension of the manufacturing process of the semiconductor integrated circuit device 100. In this embodiment, "over the circuit block 106" means any layer above the layer forming the circuit block 106 based on the semiconductor substrate 101.

The detection circuit 104 is connected to the electrically conductive pattern 105, and can detect that the electrically conductive pattern 105 has been altered. One example of an alteration of the electrically conductive pattern 105 is the removal of the electrically conductive pattern 105, or a pattern change such as a cut or a reconnection. A detailed configuration of the detection circuit 104 and the connection between the detection circuit 104 and electrically conductive pattern 105 will be described later. The detection circuit 104 and control circuit 103 are connected by, for example, wiring lines and wire bonding, and the detection circuit 104 can output the detection result to the control circuit 103. If the detection circuit 104 detects that the electrically conductive pattern 105 has been altered, the control circuit 103 can prevent the processing circuit 108 from using data held in the memory circuit 102. For example, to prevent the use of data, the control circuit 103 can inhibit access of the processing circuit 108 to the memory circuit 102, or reset data held in the memory circuit 102. Data reset herein mentioned is an operation of changing the state of the memory circuit 102 such that no data is held in it. Examples are data erase and random data overwrite. When the memory circuit 102 includes a volatile memory, the control circuit 103 may reset data by stopping power supply to the memory circuit 102.

A detailed configuration of the detection circuit 104 will be explained below with reference to FIG. 2. FIG. 2 shows a detection circuit 200 as an example of the detection circuit 104. The detection circuit 200 includes two switching circuits SW1 and SW2 and a determination circuit 210. The switching circuit SW1 has one terminal connected to a point A (a first portion) of the electrically conductive pattern 105, and the other terminal connected to a voltage source VDD that functions as a current supply line. The switching circuit SW2 has one terminal connected to the point A of the electrically conductive pattern 105, and the other terminal connected to a reference potential line. The reference potential line is, for example, a ground GND, but may also be another potential. A point B (a second portion) of the electrically conductive pattern 105 is connected to the reference potential line. The points A and B of the electrically conductive pattern 105 shown in FIG. 2 respectively correspond to the points A and B of the electrically conductive pattern 105 shown in FIG. 1. The determination circuit 210 is connected to the point A of the electrically conductive pattern 105, and detects the change in voltage at the point A. More specifically, the detection circuit 200 resets the potential at the point A to the reference potential, connects the point A to the voltage source VDD, and determines whether a preset range includes a voltage V1 at the point A after the elapse of a predetermined time. In general, the detection circuit 200 is at least configured to determine whether a preset range includes a voltage of a first portion of the electrically conductive pattern 105 when a predetermined time has elapsed since the first portion is connected to a current supply line after the potential of the first portion is reset to the reference potential. If the preset range includes the voltage V1, the detection circuit 200 can detect that the electrically conductive pattern 105 has not been altered. On the other hand, if the preset range does not include the voltage V1, the detection circuit 200 can detect that the electrically conductive pattern 105 has been altered. In general, the detection circuit 200 may be further configured to detect that the electrically conductive pattern 105 has been altered if the preset range does not include the voltage after the elapse of the predetermined time.

The determination circuit 210 includes two voltage comparators CMP11 and CMP12, an AND circuit AND1, and a D flip-flop circuit DFF11. The voltage comparator CMP11 has a positive input terminal connected to a reference voltage Vref1, and a negative input terminal connected to the point A of the electrically conductive pattern 105. An output signal S11 from the voltage comparator CMP11 is input to the AND circuit AND1. The voltage comparator CMP12 has a positive input terminal connected to the point A of the electrically conductive pattern 105, and a negative input terminal connected to a reference voltage Vref2. An output signal S12 from the voltage comparator CMP12 is input to the AND circuit AND1. Assume that Vref1 is higher than Vref2 in the example shown in FIG. 2. An output signal S13 from the AND circuit AND1 is input to the data input terminal of the D flip-flop circuit DFF11. A control signal S14 is input to the clock input terminal of the D flop-flop circuit DFF11. An output signal S15 from Q of the D flip-flop circuit DFF11 is input to the control circuit 103 as an output from the detection circuit 200. The reference voltages Vref1 and Vref2 may be voltages generated by a DA converter mounted on the semiconductor substrate 101, and may also be voltages input from outside the semiconductor substrate 101.

The operation of the detection circuit 200 will be explained below with reference to timing charts shown in FIGS. 3A to 3C. In each of FIGS. 3A to 3C, the upper half represents the state of each signal, and the lower half represents the change in voltage V1 at the point A of the electrically conductive pattern 105 with the elapse of time. FIG. 3A is an example of a timing chart for explaining the operation of the detection circuit 200 when the electrically conductive pattern 105 is not altered.

Control signals S0 and S0B respectively control ON/OFF of the switching circuits SW1 and SW2. The control signal S0B is an inverted signal of the control signal S0. Therefore, the control signal S0B is omitted from the timing charts. At time T0, the control signal S0 is Low, and the control signal S0B is High. Accordingly, the switching circuit SW1 is turned off, and the switching circuit SW2 is turned on. As a consequence, the voltage V1 at the point A of the electrically conductive pattern 105 is reset to the reference potential. That is, the switching circuit SW2 can function as a resetting unit for resetting the voltage V1 to the reference potential. The switching circuit SW2 can be omitted when the point B of the electrically conductive pattern 105 is connected to the reference potential line. When the switching circuit SW1 is turned off in this case, the point A of the electrically conductive pattern 105 is also reset to the reference potential after the elapse of a predetermined time because the electrically conductive pattern 105 is connected to the reference potential line.

When the control signal S0 changes from Low to High at time T1, the switching circuit SW1 is turned on, and the switching circuit SW2 is turned off. Consequently, the voltage source VDD supplies an electric current to the point A of the electrically conductive pattern 105 via the switching circuit SW1. That is, the switching circuit SW1 can function as a connecting unit for connecting the point A of the electrically conductive pattern 105 to the voltage source VDD. After that, the voltage V1 at the point A of the electrically conductive pattern 105 starts gradually increasing toward the voltage value supplied by the voltage source VDD, in accordance with a time constant determined by the circuit constant of the electrically conductive pattern 105. The circuit constant of the electrically conductive pattern 105 includes the parasitic resistance value and parasitic capacitance value of the electrically conductive pattern 105.

When the voltage V1 reaches the reference voltage Vref2 (at time Ta), the output signal S12 from the voltage comparator CMP12 changes from Low to High. At time Ta, the voltage V1 is lower than the reference voltage Vref1, so the output signal S11 from the voltage comparator CMP11 remains High. Accordingly, the output signal S13 from the AND circuit AND1 changes from Low to High. When the control signal S14 changes from Low to High at time T2, the output signal S15 from the D flip-flop circuit DFF11 changes from Low to High because the output signal S13 from the AND circuit AND1 is High. When the voltage V1 reaches the reference voltage Vref1 (at time Tb), the output signal S11 from the voltage comparator CMP11 changes from High to Low. As a consequence, the output signal S13 from the AND circuit AND1 changes from High to Low. As described above, the output signal S15 from the detection circuit 200 becomes High after time T2. This indicates that the detection circuit 200 detects that the electrically conductive pattern 105 has not been altered.

Time T2 is preset to exist between the time (Ta) at which the voltage V1 reaches the reference voltage Vref2 and the time (Tb) at which the voltage V1 reaches the reference voltage Vref1 when the electrically conductive pattern 105 is not altered. Accordingly, it is detected that the electrically conductive pattern 105 has not been altered if the value of the voltage V1 is equal to or higher than the reference voltage Vref2 and equal to or lower than the reference voltage Vref1 at time T2.

The operation of the detection circuit 200 when the electrically conductive pattern 105 is altered and the time constant determined by the circuit constant of the electrically conductive pattern 105 becomes smaller than that before the alteration will be explained below with reference to FIG. 3B. As described previously, at time T1, the control signal S0 changes from Low to High, and the voltage V1 starts gradually increasing. Since the time constant of the electrically conductive pattern 105 is smaller than that before the alteration, the voltage V1 increases faster than that before the alteration of the electrically conductive pattern 105.

When the voltage V1 reaches the reference voltage Vref2 (at time Tc), the output signal S12 from the voltage comparator CMP12 changes from Low to High. At time Tc, the voltage V1 is lower than the reference voltage Vref1, so the output signal S11 from the voltage comparator CMP11 remains High. Therefore, the output signal S13 from the AND circuit AND1 changes from Low to High. Then, before time T2, the voltage V1 reaches the reference voltage Vref1 (at time Td), and the output signal S11 from the voltage comparator CMP11 changes from High to Low. As a consequence, the output signal S13 from the AND circuit AND1 changes from High to Low. When the control signal S14 changes from Low to High at time T2, the output signal S15 from the D flip-flop circuit DFF11 remains Low because the output signal S13 from the AND circuit AND1 is Low. As described above, the output signal S15 from the detection circuit 200 remains Low even after time T2. This demonstrates that the detection circuit 200 detects that the electrically conductive pattern 105 has been altered. That is, it is detected that the electrically conductive pattern 105 has been altered if the value of the voltage V1 exceeds the reference voltage Vref1 at time T2.

The operation of the detection circuit 200 when the electrically conductive pattern 105 is altered and the time constant determined by the circuit constant of the electrically conductive pattern 105 becomes larger than that before the alteration will be explained below with reference to FIG. 3C. As described previously, at time T1, the control signal S0 changes from Low to High, and the voltage V1 starts gradually increasing. Since the time constant of the electrically conductive pattern 105 is larger than that before the alteration, the voltage V1 increases more slowly than that before the alteration of the electrically conductive pattern 105.

Time T2 comes before the voltage V1 reaches the reference voltage Vref2, and the control signal S14 changes from Low to High. Since the output signal S13 from the AND circuit AND1 is Low, the output signal S15 from the D flop-flop circuit DFF11 remains Low. When the voltage V1 reaches the reference voltage Vref2 (at time Te), the output signal S12 from the voltage comparator CMP12 changes from Low to High. At time Te, the voltage V1 is lower than the reference voltage Vref1, so the output signal S11 from the voltage comparator CMP11 remains High. Therefore, the output signal S13 from the AND circuit AND1 changes from Low to High. Then, the voltage V1 reaches the reference voltage Vref1 (at time Tf), and the output signal S11 from the voltage comparator CMP11 changes from High to Low. As a consequence, the output signal S13 from the AND circuit AND1 changes from High to Low. As described above, the output signal S15 from the detection circuit 200 remains Low even after time T2. This shows that the detection circuit 200 detects that the electrically conductive pattern 105 has been altered. That is, it is detected that the electrically conductive pattern 105 has been altered if the value of the voltage V1 is lower than the reference voltage Vref2 at time T2.

The reference voltages Vref1 and Vref2 and times T1 and T2 used by the detection circuit 200 can be set when designing the semiconductor integrated circuit device 100, can be set when manufacturing the semiconductor integrated circuit device 100, and can also be set personally by the user after shipment. These set values can be held in the detection circuit 104, and can also be held in the nonvolatile memory of the memory circuit 102. When the set values are held in the memory circuit 102, they cannot be used any longer if the electrically conductive pattern 105 is altered. However, it is still possible to hold these set values in the memory circuit 102, because the user perhaps discards the semiconductor integrated circuit device 100 in which the electrically conductive pattern 105 is altered.

Figure 4:
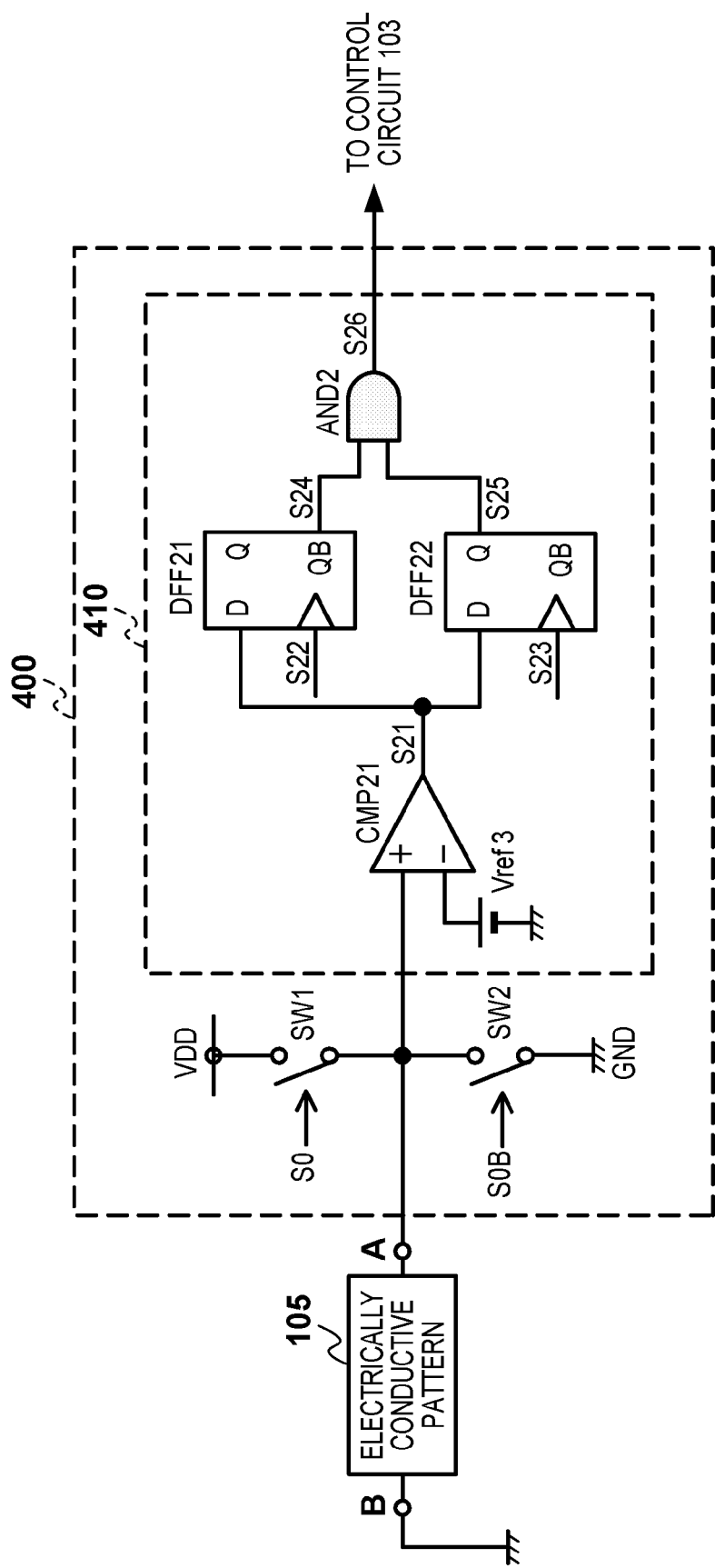
FIG. 4 is a view for explaining another configuration example of the detection circuit of the embodiment of the present invention.

Another example of the detailed configuration of the detection circuit 104 will now be explained with reference to FIG. 4. FIG. 4 shows a detection circuit 400 as another example of the detection circuit 104. The detection circuit 400 is obtained by replacing the determination circuit 210 of the detection circuit 200 with a determination circuit 410. Therefore, the arrangement of the determination circuit 410 will be explained below.

The determination circuit 410 includes a voltage comparator CMP21, an AND circuit AND2, and two D flip-flop circuits DFF21 and DFF22. The voltage comparator CMP21 has a positive input terminal connected to the point A of the electrically conductive pattern 105, and a negative input terminal connected to a reference voltage Vref3. An output signal S21 from the voltage comparator CMP21 is input to the data input terminals of the D flip-flop circuits DFF21 and DFF22. A control signal S22 is input to the clock input terminal of the D flip-flop circuit DFF21. A control signal S23 is input to the clock input terminal of the D flip-flop circuit DFF22. An output signal S24 from QB of the D flip-flop circuit DFF21 and an output signal S25 from Q of the D flip-flop circuit DFF22 are input to the AND circuit AND2. An output signal S26 from the AND circuit AND2 is input to the control circuit 103 as an output from the detection circuit 400. The reference voltage Vref3 may be a voltage generated by a DA converter mounted on the semiconductor substrate 101, and may also be a voltage input from outside the semiconductor substrate 101.

Figure 5A:
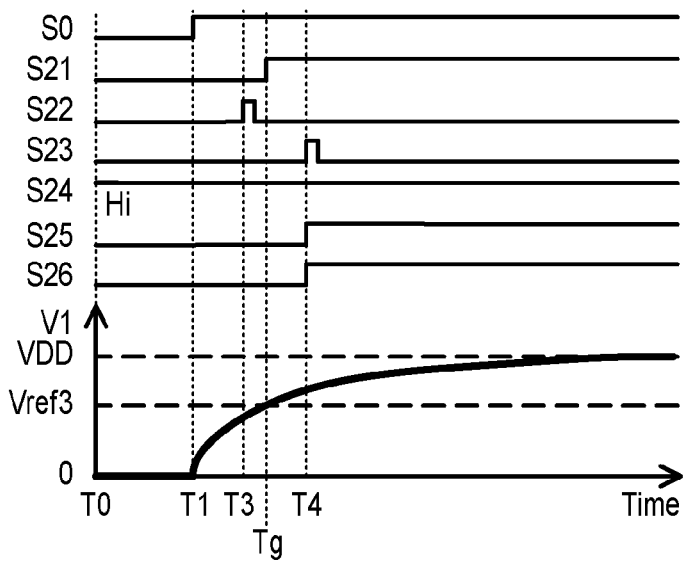
FIGS. 5A to 5C are views for explaining other examples of the timing chart of the embodiment of the present invention.
Figure 5B:
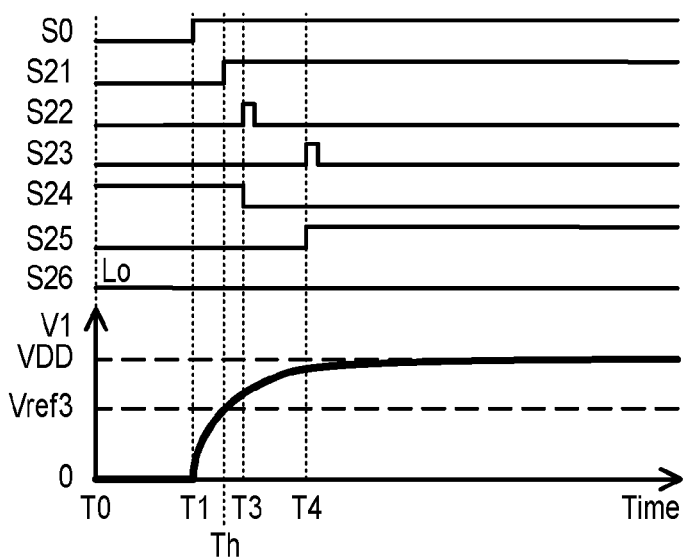
Figure 5C:
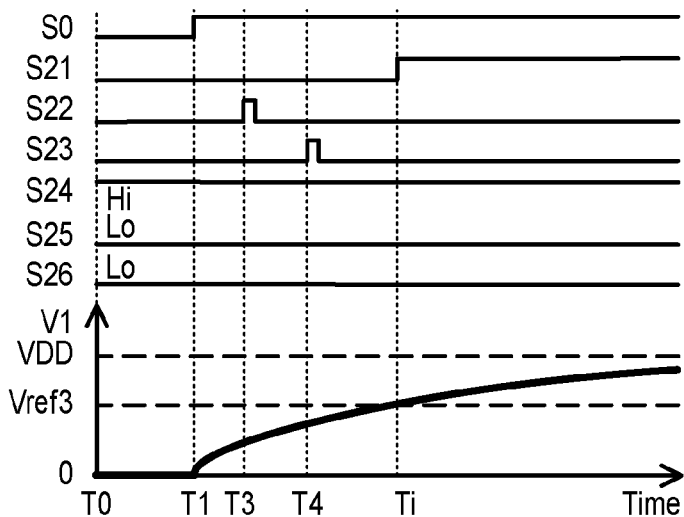

The operation of the detection circuit 400 will be explained below with reference to timing charts shown in FIGS. 5A to 5C. In each of FIGS. 5A to 5C, the upper half represents the state of each signal, and the lower half represents the change in voltage V1 at the point A of the electrically conductive pattern 105 with the elapse of time. FIG. 5A is an example of a timing chart for explaining the operation of the detection circuit 400 when the electrically conductive pattern 105 is not altered. The operations of the switching circuits SW1 and SW2 are the same as those shown in FIGS. 3A to 3C, so a repetitive explanation will be omitted.

When the control signal S0 changes from Low to High at time T1, the switching circuit SW1 is turned on, and the switching circuit SW2 is turned off. Consequently, the voltage source VDD supplies an electric current to the point A of the electrically conductive pattern 105 via the switching circuit SW1. After that, the voltage V1 at the point A of the electrically conductive pattern 105 starts gradually increasing toward the voltage value supplied by the voltage source VDD, in accordance with the time constant determined by the circuit constant of the electrically conductive pattern 105. At time T1, the output signal S21 from the voltage comparator CMP21 is Low, the output signal S24 from QB of the D flip-flop circuit DFF21 is High, and the output signal S25 from Q of the D flip-flop circuit DFF22 is Low. Therefore, the output signal S26 from the AND circuit AND2 is Low.

At time T3, the control signal S22 changes from Low to High. Since the output signal S21 is Low, the output signal S24 from QB of the D flip-flop circuit DFF21 remains High. When the voltage V1 reaches the reference voltage Vref3 (at time Tg), the output signal S21 from the voltage comparator CMP21 changes from Low to High. At time T4, the control signal S23 changes from Low to High. Since the output signal S21 is High, the output signal S25 from Q of the D flip-flop circuit DFF22 changes from Low to High. Accordingly, the output signal S26 from the AND circuit AND2 also changes from Low to High. As described above, the output signal S26 from the detection circuit 400 becomes High after time T4. This indicates that the detection circuit 400 detects that the electrically conductive pattern 105 has not been altered.

Times T3 and T4 are preset such that the time (Tg) at which the voltage V1 reaches the reference voltage Vref3 when the electrically conductive pattern 105 is not altered exists between times T3 and T4. Therefore, it is detected that the electrically conductive pattern 105 has not been altered if the reference voltage Vref3 is equal to or higher than the voltage V1 at time T3 and equal to or lower than the voltage V1 at time T4.

The operation of the detection circuit 400 when the electrically conductive pattern 105 is altered and the time constant determined by the circuit constant of the electrically conductive pattern 105 becomes smaller than that before the alteration will be explained below with reference to FIG. 5B. As described previously, at time T1, the control signal S0 changes from Low to High, and the voltage V1 starts gradually increasing. Since the time constant of the electrically conductive pattern 105 is smaller than that before the alteration, the voltage V1 increases faster than that before the alteration of the electrically conductive pattern 105.

When the voltage V1 reaches the reference voltage Vref3 (at time Th), the output signal S21 from the voltage comparator CMP21 changes from Low to High. Since the time constant is smaller than that before the alteration, time Tg is earlier than preset time T3. At time T3, the control signal S22 changes from Low to High. Since the output signal S21 is High, the output signal S24 from QB of the D flip-flop circuit DFF21 changes from High to Low. At time T4, the control signal S23 changes from Low to High. Since the output signal S21 is High, the output signal S25 from Q of the D flip-flop circuit DFF22 changes from Low to High. As described above, the output signal S26 from the detection circuit 400 remains Low even after time T4. This represents that the detection circuit 400 detects that the electrically conductive pattern 105 has been altered. Accordingly, it is detected that the electrically conductive pattern 105 has been altered if the reference voltage Vref3 is lower than the voltage V1 at time T3.

The operation of the detection circuit 400 when the electrically conductive pattern 105 is altered and the time constant determined by the circuit constant of the electrically conductive pattern 105 becomes larger than that before the alteration will be explained below with reference to FIG. 5C. As described previously, at time T1, the control signal S0 changes from Low to High, and the voltage V1 starts gradually increasing. Since the time constant of the electrically conductive pattern 105 is larger than that before the alteration, the voltage V1 increases more slowly than that before the alteration of the electrically conductive pattern 105.

At time T3, the control signal S22 changes from Low to High. Since the output signal S21 is Low, the output signal S24 from QB of the D flip-flop circuit DFF21 remains High. At time T4, the control signal S23 changes from Low to High. Since the output signal S21 is Low, the output signal S25 from Q of the D flip-flop circuit DFF22 remains Low. When the voltage V1 reaches the reference voltage Vref3 (at time Ti), the output signal S21 from the voltage comparator CMP21 changes from Low to High. Since the time constant is larger than that before the alteration, time Ti is later than preset time T4. As described above, the output signal S26 from the detection circuit 400 remains Low even after time T4. This shows that the detection circuit 400 detects that the electrically conductive pattern 105 has been altered. Accordingly, it is detected that the electrically conductive pattern 105 has been altered if the reference voltage Vref3 is higher than the voltage V1 at time T4.

The reference voltage Vref3 and times T1, T3, and T4 used by the detection circuit 400 can be set when designing the semiconductor integrated circuit device 100, can be set when manufacturing the semiconductor integrated circuit device 100, and can also be set personally by the user after shipment. These set values can be held in the detection circuit 104, and can also be held in the nonvolatile memory of the memory circuit 102.

Figure 9:
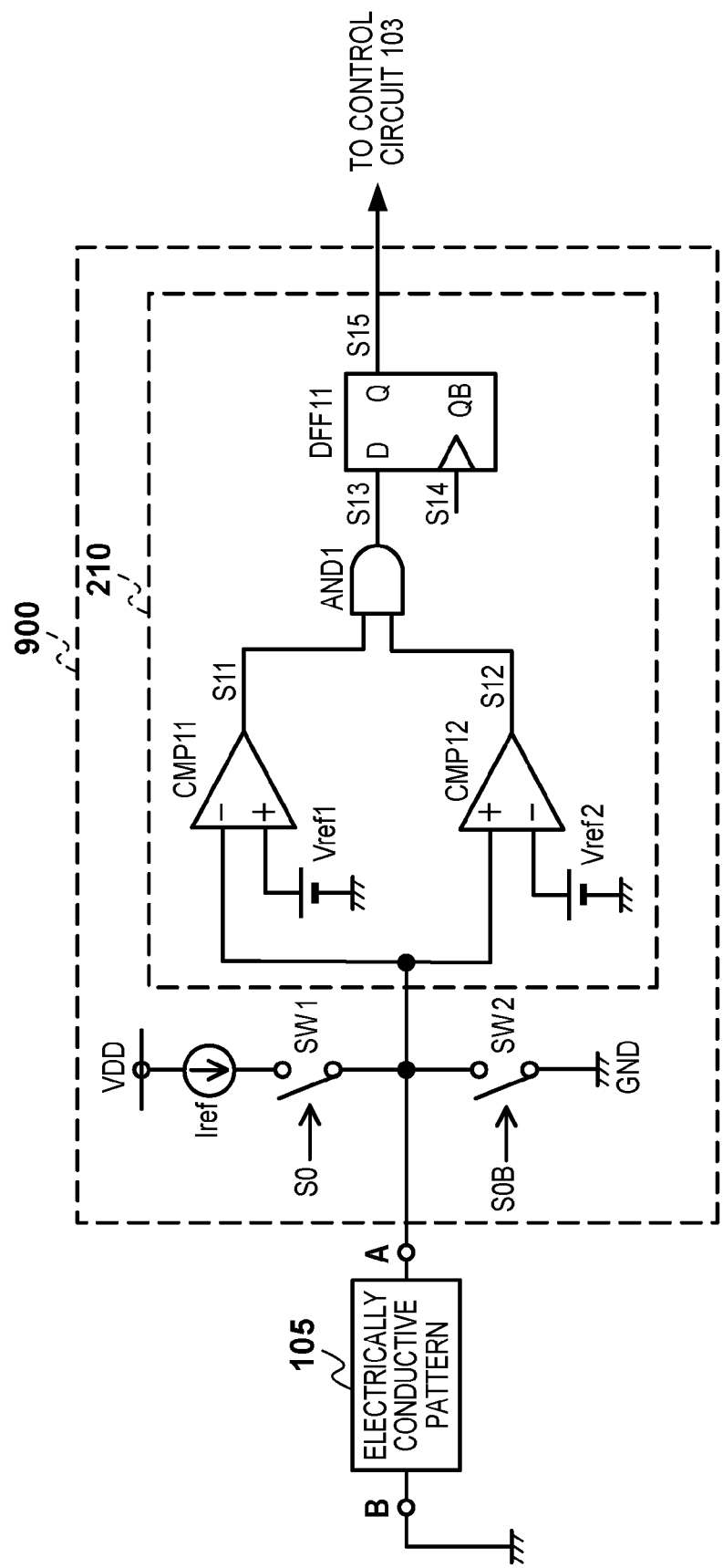
FIG. 9 is a view for explaining another configuration example of the detection circuit of the embodiment of the present invention.

Another example of the detailed configuration of the detection circuit 104 will be explained below with reference to FIG. 9. FIG. 9 shows a detection circuit 900 as another example of the detection circuit 104. The detection circuit 900 is obtained by connecting a current source Iref between the switching circuit SW1 and voltage source VDD in the detection circuit 200 shown in FIG. 2. In the detection circuit 900, the product of the resistance value of the electrically conductive pattern 105 and the output current from the current source Iref determines the convergent voltage of the voltage V1 at the point A of the electrically conductive pattern 105. Therefore, the voltage V1 is less affected by the voltage fluctuation of the voltage source VDD than that in the detection circuit 200 shown in FIG. 2. This makes it possible to decrease the difference between the reference voltages Vref1 and Vref2, and increase the detection accuracy.

Figure 10:
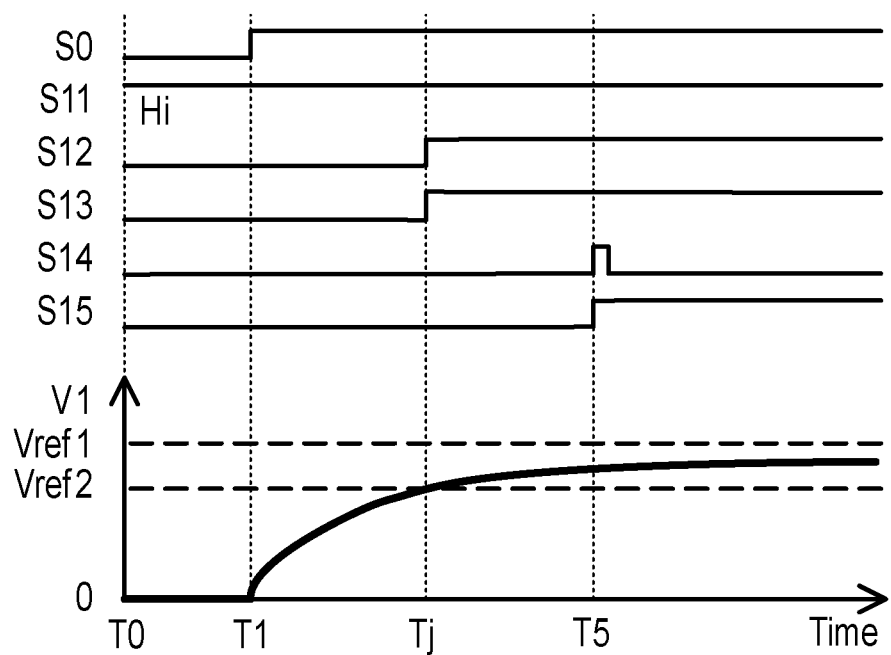
FIG. 10 is a view for explaining another example of the timing chart of the embodiment of the present invention.

The operation of the detection circuit 900 will be explained below with reference to a timing chart shown in FIG. 10. In FIG. 10, the upper half represents the state of each signal, and the lower half represents the change in voltage V1 at the point A of the electrically conductive pattern 105 with the elapse of time. FIG. 10 is an example of a timing chart for explaining the operation of the detection circuit 900 when the electrically conductive pattern 105 is not altered. The operation of the detection circuit 900 when the electrically conductive pattern 105 is altered is the same as those shown in FIGS. 3B and 3C, so a repetitive explanation will be omitted.

Similar to FIG. 3A, when the control signal S0 changes from Low to High at time T1, the switching circuit SW1 is turned on, and the switching circuit SW2 is turned off. Consequently, the current source Iref that functions as a current supply line supplies an electric current to the point A of the electrically conductive pattern 105 via the switching circuit SW1. After that, the voltage V1 at the point A of the electrically conductive pattern 105 starts gradually increasing toward the voltage determined by the parasitic resistance value of the electrically conductive pattern 105 and the current value of the current source Iref, in accordance with the time constant determined by the circuit constant of the electrically conductive pattern 105.

When the voltage V1 reaches the reference voltage Vref2 (at time Tj), the output signal S12 from the voltage comparator CMP12 changes from Low to High. At time Tj, the voltage V1 is lower than the reference voltage Vref1, so the output signal S11 from the voltage comparator CMP11 remains High. Accordingly, the output signal S13 from the AND circuit AND1 changes from Low to High. When the control signal S14 changes from Low to High at time T5, the output signal S15 from the D flip-flop circuit DFF11 changes from Low to High because the output signal S13 from the AND circuit AND1 is High. As described above, the output signal S15 from the detection circuit 900 becomes high after time T5. This demonstrates that the detection circuit 900 detects that the electrically conductive pattern 105 has not been altered. Thus, it is detected that the electrically conductive pattern 105 has not been altered if the voltage V1 at time T5 is equal to or higher than the reference voltage Vref2 and equal to or lower than the reference voltage Vref1. The time from time T1 to time T5 can be set to such an extent that the value of the voltage V1 converges.

If the electrically conductive pattern 105 is altered and its parasitic resistance value decreases, the convergent voltage of the voltage V1 becomes lower than the reference voltage Vref2. On the other hand, if the electrically conductive pattern 105 is altered and its parasitic resistance value increases, the convergent voltage of the voltage V1 becomes higher than the reference voltage Vref1. In either case, the output signal S15 from the detection circuit 900 becomes Low at time T5, so it is detected that the electrically conductive pattern 105 has been altered.

Figure 11:
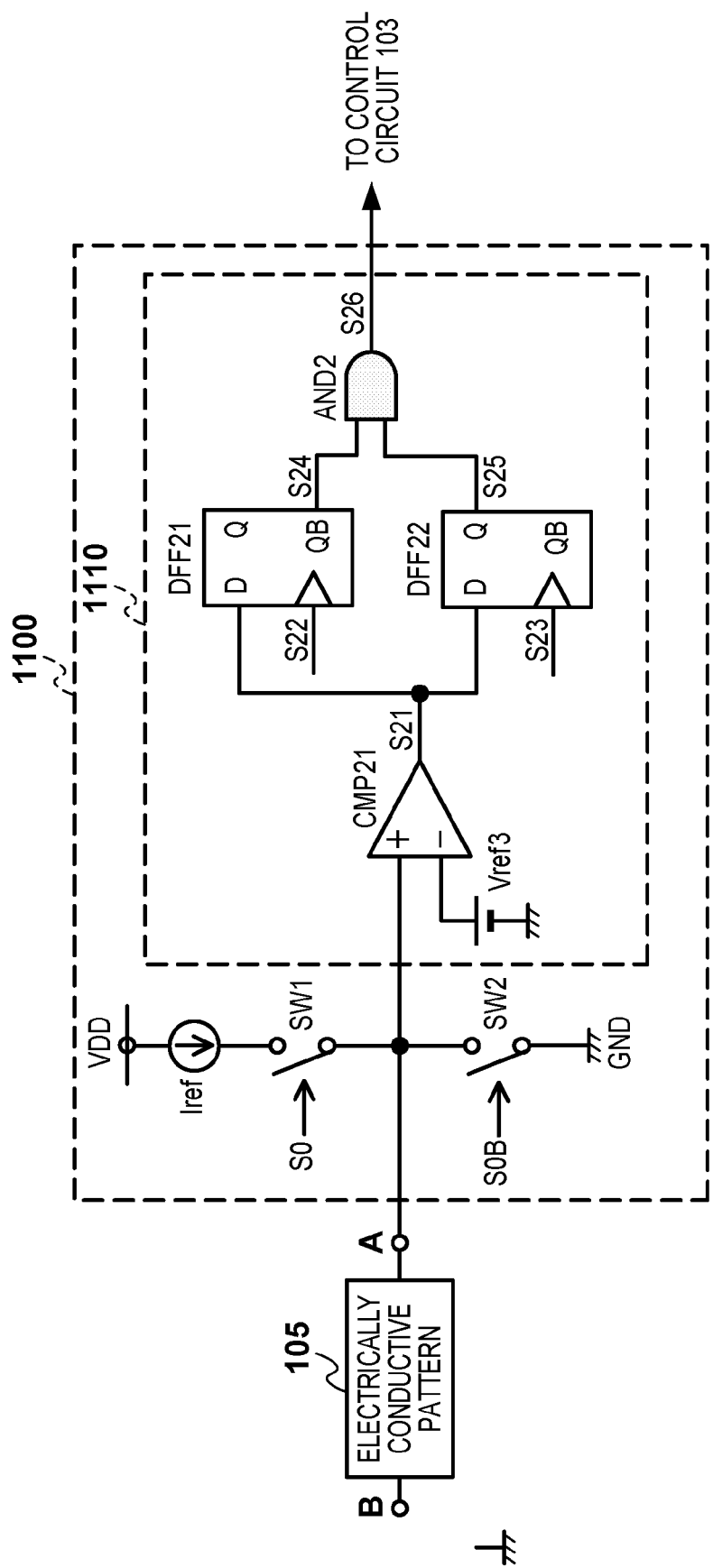
FIG. 11 is a view for explaining still another configuration example of the detection circuit of the embodiment of the present invention.

Another example of the detailed configuration of the detection circuit 104 will be explained below with reference to FIG. 11. FIG. 11 shows a detection circuit 1100 as another example of the detection circuit 104. The detection circuit 1100 is obtained by connecting the switching circuit SW1 and voltage source VDD via a current source Iref and floating the point B of the electrically conductive pattern 105 in the detection circuit 400 shown in FIG. 4. The arrangement of a determination circuit 1110 is the same as that of the determination circuit 410. Since the point B of the electrically conductive pattern 105 floats, the voltage V1 at the point A of the electrically conductive pattern 105 linearly increases with time in accordance with condition CV=IT where C is the parasitic capacitance value of the electrically conductive pattern 105, I is the current value of the current source Iref, and T is the time elapsed since the switching circuit SW1 is turned on. Since the voltage V1 linearly increases with time T, the voltage V1 is less influenced by the fluctuation of the voltage source VDD than that in the detection circuit 400. This makes it possible to shorten the interval between the times at which pulses are supplied to the D flip-flop circuits DFF21 and DFF22, and increase the detection accuracy.

Figure 12:
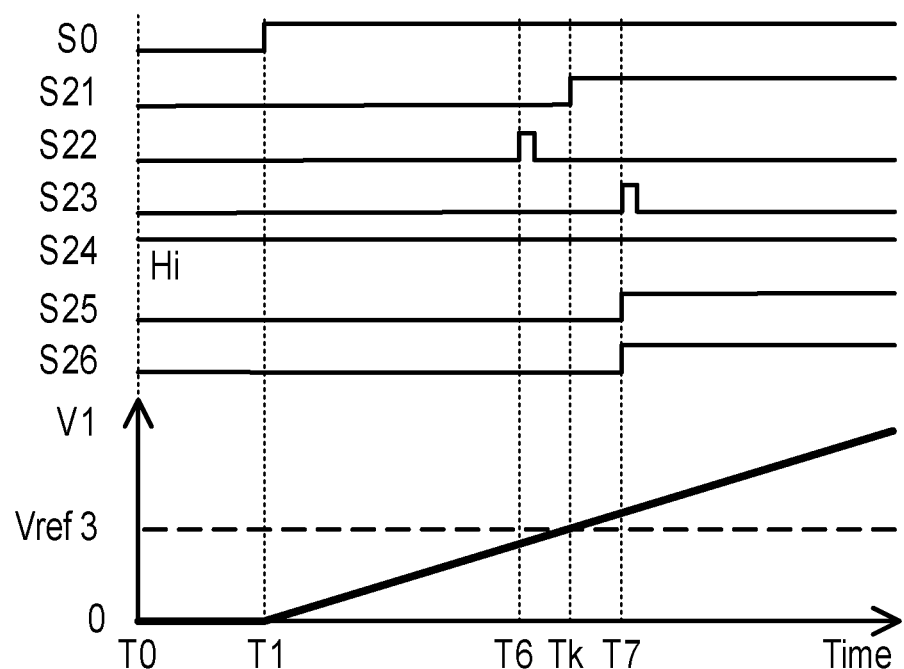
FIG. 12 is a view for explaining still another example of the timing chart of the embodiment of the present invention.

The operation of the detection circuit 1100 will be explained below with reference to a timing chart shown in FIG. 12. In FIG. 12, the upper half represents the state of each signal, and the lower half represents the change in voltage V1 at the point A of the electrically conductive pattern 105 with the elapse of time. FIG. 12 is an example of a timing chart for explaining the operation of the detection circuit 1100 when the electrically conductive pattern 105 is not altered. The operation of the detection circuit 1100 when the electrically conductive pattern 105 is altered is the same as those shown in FIGS. 5B and 5C, so a repetitive explanation will be omitted.

When the control signal S0 changes from Low to High at time T1, the switching circuit SW1 is turned on, and the switching circuit SW2 is turned off. Consequently, the current source Iref supplies an electric current to the point A of the electrically conductive pattern 105 via the switching circuit SW1. After that, the voltage V1 at the point A of the electrically conductive pattern 105 starts linearly increasing in accordance with condition CV=IT described above. At time T1, the output signal S21 from the voltage comparator CMP21 is Low, the output signal S24 from QB of the D flip-flop circuit DFF21 is High, and the output signal S25 from Q of the D flip-flop circuit DFF22 is Low. Therefore, the output signal S26 from the AND circuit AND2 is Low.

At time T6, the control signal S22 changes from Low to High. Since the output signal S21 is Low, the output signal S24 from QB of the D flip-flop circuit DFF21 remains High. When the voltage V1 reaches the reference voltage Vref3 (at time Tk), the output signal S21 from the voltage comparator CMP21 changes from Low to High. At time T7, the control signal S23 changes from Low to High. Since the output signal S21 is High, the output signal S25 from Q of the D flip-flop circuit DFF22 changes from Low to High. Accordingly, the output S26 from the AND circuit AND2 also changes from Low to High. As described above, the output signal S26 from the detection circuit 400 becomes High after time T7. This represents that the detection circuit 1100 detects that the electrically conductive pattern 105 has not been altered.

Times T6 and T7 are preset such that the time (Tk) at which the voltage V1 reaches the reference voltage Vref3 when the electrically conductive pattern 105 is not altered exists between T6 and T7. Accordingly, it is detected that the electrically conductive pattern 105 has not been altered if the reference voltage Vref3 is equal to or higher than the voltage V1 at time T6 and equal to or lower than the voltage V1 at time T7.

If the electrically conductive pattern 105 is altered and its parasitic capacitance value decreases, the increase ratio (dV1/dt) per unit time of the voltage V1 increases. On the other hand, if the electrically conductive pattern 105 is altered and its parasitic capacitance value increases, the increase ratio (dV1/dt) per unit time of the voltage V1 decreases. In either case, the output signal S15 from the detection circuit 1100 becomes Low at time T7, so it is detected that the electrically conductive pattern 105 has been altered.

Next, modifications of the shape of the electrically conductive pattern 105 will be explained below with reference to FIGS. 6A to 6F. All electrically conductive patterns to be explained below can be formed by the critical dimension of the semiconductor process of manufacturing the semiconductor integrated circuit device 100. Also, points A and B of each electrically conductive pattern respectively correspond to the points A and B of the electrically conductive pattern 105 shown in FIG. 1.

Figure 6A:
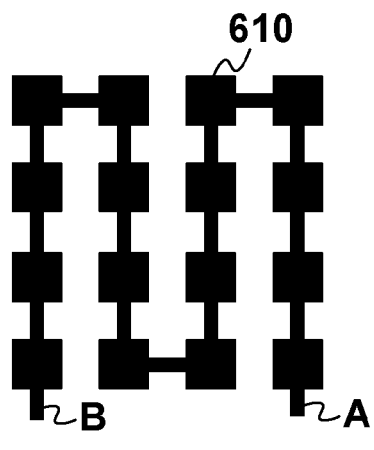
FIGS. 6A to 6F are views for explaining modifications of the shape of an electrically conductive pattern 105 of the embodiment of the present invention.
Figure 6B:
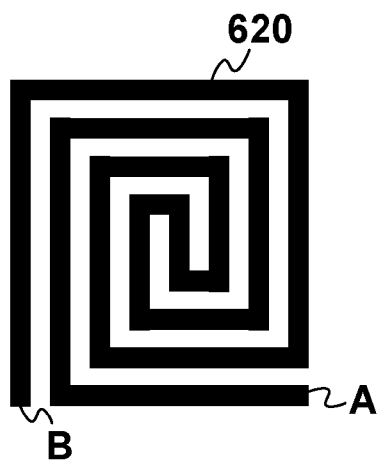
Figure 6C:
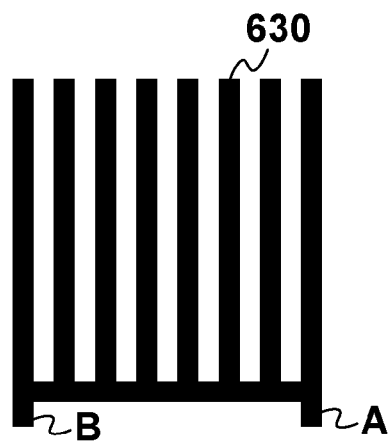
Figure 6D:
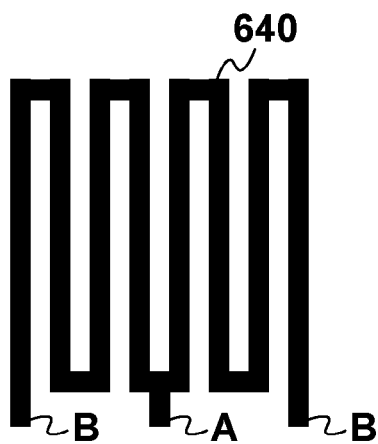
Figure 6E:
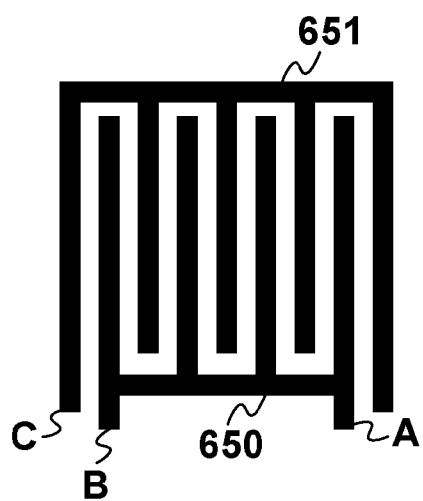
Figure 6F:
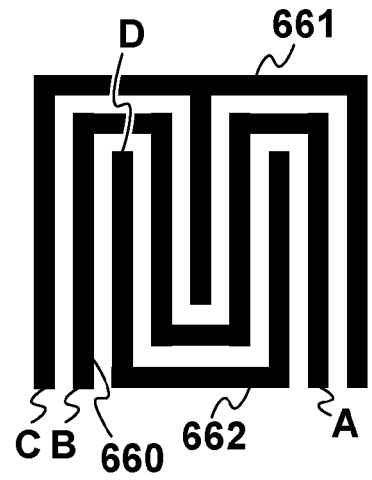

An electrically conductive pattern 610 shown in FIG. 6A has a shape in which a plurality of rectangular patterns are connected by electrically conductive lines thinner than the rectangular patterns. The electrically conductive pattern 610 can increase the parasitic capacitance while suppressing the increase in parasitic resistance. The plurality of rectangular patterns may have different sizes. An electrically conductive pattern 620 shown in FIG. 6B has a pattern that spirally extends from the point A positioned in the outer periphery toward the central portion, and then spirally extends from the central portion toward the point B positioned in the outer periphery. An electrically conductive pattern 630 shown in FIG. 6C has a comb-shaped pattern. An electrically conductive pattern 640 shown in FIG. 6D has a pattern in which one electrically conductive line meanders. The point A is positioned near the center of this electrically conductive line, and the point B is positioned at each of the two ends. An electrically conductive pattern 650 shown in FIG. 6E has a comb shape and is meshed with an electrically conductive pattern 651 having another comb shape. A point C of the electrically conductive pattern 651 is connected to a reference potential line (for example, GND). This arrangement can increase the parasitic capacitance of the electrically conductive pattern 650. An electrically conductive pattern 660 shown in FIG. 6F has a pattern in which one electrically conductive line meanders, and electrically conductive patterns 661 and 662 are arranged parallel to the electrically conductive pattern 660. A point C of the electrically conductive pattern 661 and a point D of the electrically conductive pattern 662 are connected to a reference potential line (for example, GND). This arrangement can increase the parasitic capacitance of the electrically conductive pattern 650.

Figure 2:
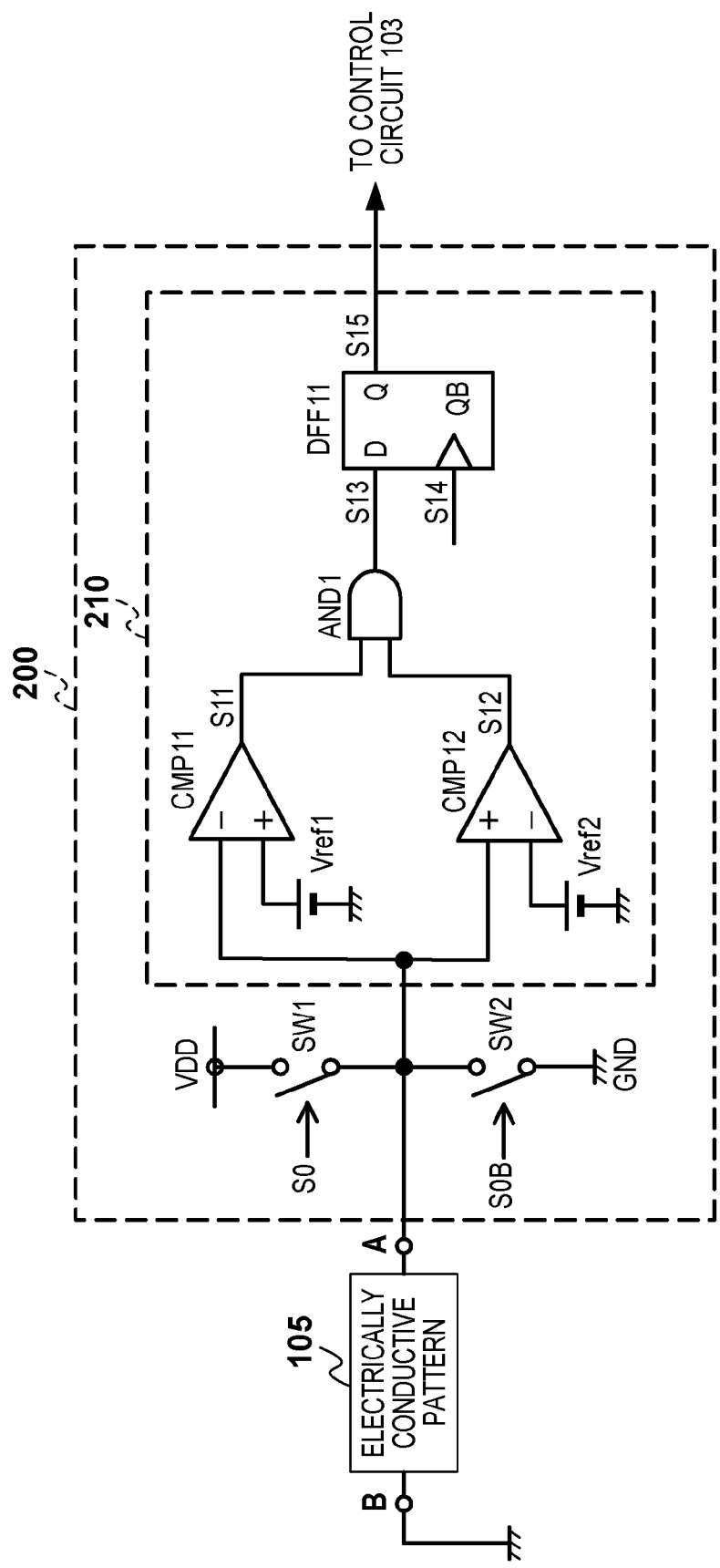
FIG. 2 is a view for explaining a configuration example of a detection circuit of the embodiment of the present invention.
Figure 7:
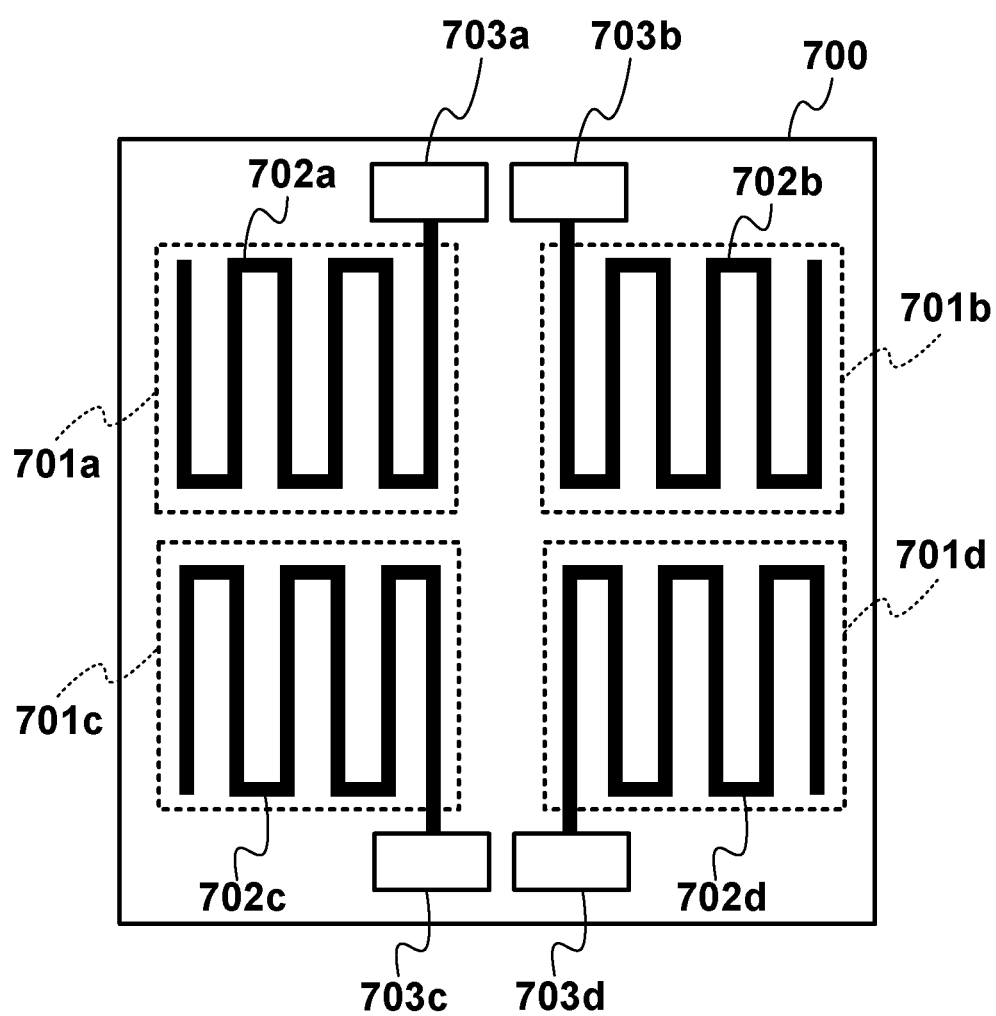
FIG. 7 is a view for explaining an arrangement including a plurality of electrically conductive patterns of the embodiment of the present invention.

In the example shown in FIG. 1, the arrangement in which one electrically conductive pattern 105 is formed over the circuit block 106 is explained. However, the electrically conductive pattern formed on the circuit block 106 may also be divided into a plurality of portions. An example of an arrangement including a plurality of electrically conductive patterns will be explained below with reference to FIG. 7. Referring to FIG. 7, four electrically conductive patterns 702a, 702b, 702c, and 702d are respectively formed on different regions 701a, 701b, 701c, and 701d on a semiconductor substrate 700. Each of the electrically conductive patterns 702a to 702d corresponds to the electrically conductive pattern 105 explained with reference to FIG. 1, and the modifications explained with reference to FIGS. 6A to 6F are applicable. The electrically conductive patterns 702a, 702b, 702c, and 702d are respectively connected to detection circuits 703a, 703b, 703c, and 703d. Each of the detection circuits 703a to 703d corresponds to the detection circuit 104 described above. The electrically conductive patterns 702a to 702d may have different circuit constants. The electrically conductive patterns 702a to 702d may partially or entirely overlap each other. This can make analysis of a circuit block on which the electrically conductive patterns 702a to 702d overlap each other more difficult.

In the above-described example, the arrangement in which the analysis of the circuit block 106 formed on the semiconductor substrate 101 is made difficult by forming the electrically conductive pattern 105 over the circuit block 106 is explained. However, when manufacturing a semiconductor integrated circuit device by mounting the semiconductor substrate 101 on a mounting board, the circuit block 106 may be analyzed from the back side of the semiconductor substrate 101. The operation state of a transistor can be confirmed from the back surface of the semiconductor substrate 101 by using recent analytical techniques such as an LVP (Laser Voltage Probing) method or a back side emission microscope. Therefore, in another embodiment of the present invention to be explained with reference to FIG. 8, an electrically conductive pattern protects the back surface of the semiconductor substrate 101 as well.

Figure 8:
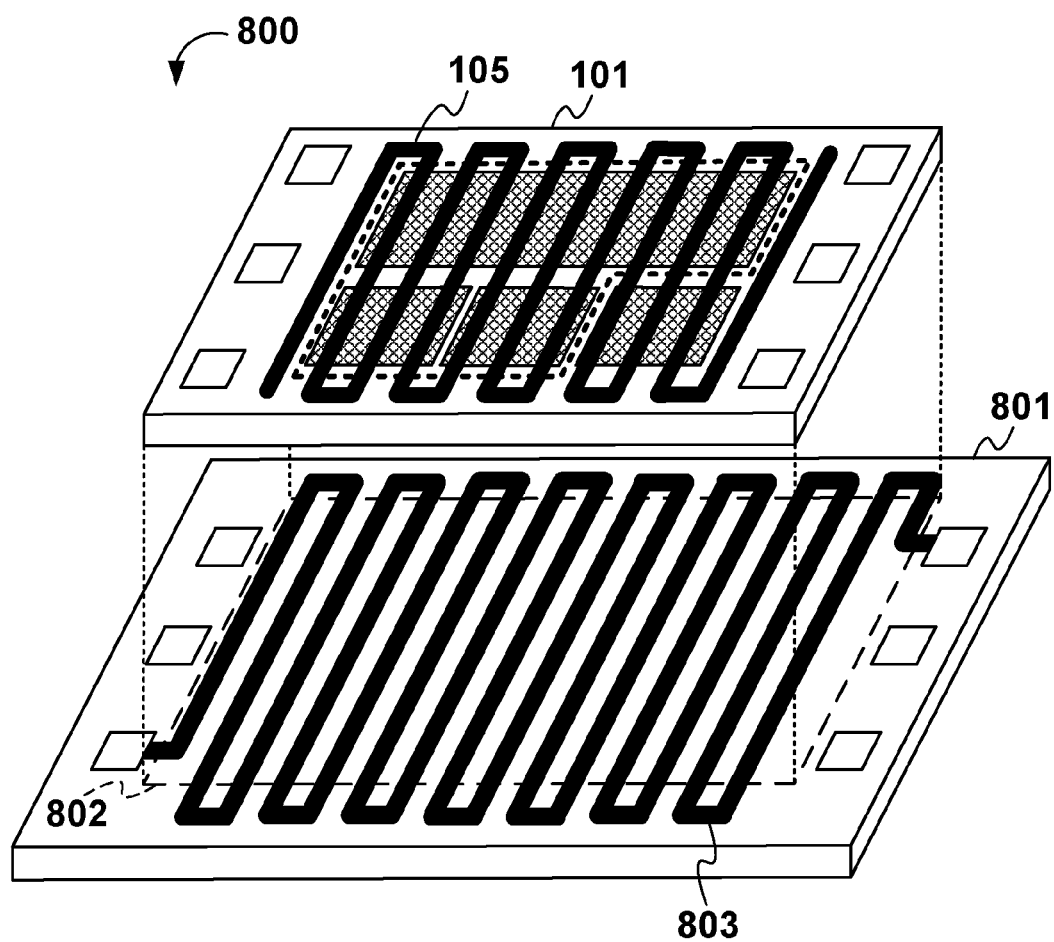
FIG. 8 is a view for explaining another example of the arrangement of the semiconductor integrated circuit device of the embodiment of the present invention.

A semiconductor integrated circuit device 800 shown in FIG. 8 is manufactured by mounting the semiconductor substrate 101 on a mounting board 801. An electrically conductive pattern 803 is formed over a region 802 of the mounting board 801 on which the semiconductor substrate 101 is to be mounted. The electrically conductive pattern 803 can be formed on the entire surface of the region 802 as shown in FIG. 8, and can also be formed on at least a portion of the region 802. When the electrically conductive pattern 803 is formed on only a portion of the region 802, the security of that portion improves. The arrangement of the electrically conductive pattern 803 is the same as that of the electrically conductive pattern 105, and a repetitive explanation will be omitted. The electrically conductive pattern 803 can be connected to the detection circuit 804 formed on the semiconductor substrate 101. Accordingly, a voltage V1 depends on the circuit constants of the electrically conductive patterns 105 and 803. If at least one of the electrically conductive patterns 105 and 803 is altered, therefore, the detection circuit 104 can detect the alteration. Also, the semiconductor substrate 101 is mounted on the mounting board 801 such that the back surface of the semiconductor substrate 101 faces the region 802. This makes it possible to protect the front side of the semiconductor substrate 101 by the electrically conductive pattern 105, and protect the back side of the semiconductor substrate 101 by the electrically conductive pattern 803. The electrically conductive patterns 105 and 803 may be connected to different detection circuits. In this case, outputs from these detection circuits are input to the control circuit 103. If at least one detection circuit outputs a signal indicating the detection of an alteration, the control circuit 103 can make data stored in the memory circuit 102 unusable. The detection circuit to be connected to the electrically conductive pattern 803 can be positioned on the semiconductor substrate 101, and can also be positioned on the mounting board 801. In addition, in this embodiment, the electrically conductive pattern 803 can be formed on the surface of the mounting board 801, and can also be formed in an interlayer of a multilayered circuit board.

In the various embodiments of the present invention as described above, it is possible to detect that an electrically conductive pattern formed on a circuit block has been altered. To analyze the circuit block, the electrically conductive pattern must be altered. Even when using a processing apparatus such as the FIB apparatus, however, it is very difficult to alter the electrically conductive pattern while maintaining its circuit constant. Accordingly, the present invention detects the change in voltage of the electrically conductive pattern, which depends on the circuit constant of the electrically conductive pattern. This makes it possible to detect the alteration of the electrically conductive pattern more accurately, and as a consequence improve the security of data held in the semiconductor integrated circuit device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-197145, filed Sep. 2, 2010, which is hereby incorporated by reference herein in its entirety.

What is claimed is:

1. A semiconductor integrated circuit device comprising:
a circuit block formed on a semiconductor substrate;
an electrically conductive pattern located at the same surface of the semiconductor substrate as the circuit block and formed over a portion to be protected of the circuit block;
a resetting unit configured to reset a potential of a first portion of the electrically conductive pattern to a reference potential;
a connecting unit configured to connect the first portion to a current supply line; and
a detection circuit configured to determine whether a preset range includes a voltage of the first portion when a predetermined time has elapsed since the first portion is connected to the current supply line after the potential of the first portion is reset to the reference potential,
wherein a change in voltage of the first portion depends on a circuit constant of the electrically conductive pattern.

2. The device according to claim 1, wherein the detection circuit is further configured to detect that the electrically conductive pattern has been altered if the preset range does not include the voltage after the elapse of the predetermined time.

3. The device according to claim 1, wherein
the circuit block comprises:
a memory circuit configured to hold data; and
a control circuit configured to control access to the data held in the memory circuit, and
the control circuit is further configured to perform one of an operation of resetting the data held in the memory circuit and an operation of inhibiting access to the data held in the memory circuit, if it is detected that the electrically conductive pattern has been altered.

4. The device according to claim 1, wherein the current supply line is a voltage source, and a second portion of the electrically conductive pattern is connected to a reference potential line.

5. The device according to claim 1, wherein the current supply line is a current source, and a second portion of the electrically conductive pattern is connected to a reference potential line.

6. The device according to claim 1, wherein the current supply line is a current source, and the electrically conductive pattern is floated after the potential of the first portion is reset to the reference potential.

7. The device according to claim 1, wherein the circuit constant includes a parasitic resistance and parasitic capacitance of the electrically conductive pattern.

8. The device according to claim 1, further comprising: a mounting board on which the semiconductor substrate is mounted; and another electrically conductive pattern covering at least a portion of a region of the mounting board, on which the semiconductor substrate is to be mounted, wherein the detection circuit is further configured to detect that the another electrically conductive pattern has been altered.

* * * * *